(12) United States Patent
Nakamura et al.

(10) Patent No.: US 12,342,725 B2
(45) Date of Patent: Jun. 24, 2025

(54) PIEZOELECTRIC DEVICE AND METHOD OF MANUFACTURING PIEZOELECTRIC DEVICE

(71) Applicant: Nitto Denko Corporation, Ibaraki (JP)

(72) Inventors: Daisuke Nakamura, Ibaraki (JP); Naoki Nagaoka, Ibaraki (JP); Taketo Ishikawa, Ibaraki (JP); Hironobu Machinaga, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 848 days.

(21) Appl. No.: 17/439,504

(22) PCT Filed: Mar. 10, 2020

(86) PCT No.: PCT/JP2020/010302
§ 371 (c)(1),
(2) Date: Sep. 15, 2021

(87) PCT Pub. No.: WO2020/189413
PCT Pub. Date: Sep. 24, 2020

(65) Prior Publication Data
US 2022/0158071 A1  May 19, 2022

(30) Foreign Application Priority Data
Mar. 20, 2019 (JP) .................. 2019-052876

(51) Int. Cl.
*H01L 41/04* (2006.01)
*H10N 30/00* (2023.01)
(Continued)

(52) U.S. Cl.
CPC ............. *H10N 30/87* (2023.02); *H10N 30/06* (2023.02); *H10N 30/708* (2024.05);
(Continued)

(58) Field of Classification Search
CPC ...... H10N 30/87; H10N 30/853; H10N 30/708
(Continued)

(56) References Cited

U.S. PATENT DOCUMENTS 5,315,205 A * 5/1994 Ohno ................ H10N 30/2042
310/357
2002/0043901 A1 4/2002 Kihara et al.
(Continued)

FOREIGN PATENT DOCUMENTS

CA 2052495 A1 4/1992
CN 1639868 A 7/2005
(Continued)

OTHER PUBLICATIONS

Office Acton issued on Aug. 21, 2023 for corresponding Korean Patent Application No. 10-2021-7029494, along with an English translation (11 pages).
(Continued)

*Primary Examiner* — Derek J Rosenau
(74) *Attorney, Agent, or Firm* — HAUPTMAN HAM, LLP

(57) ABSTRACT

A piezo electric device having a configuration that can suppress the formation of a leakage path between electrodes that sandwich a piezoelectric layer and also reduce deterioration in the piezoelectric characteristics, is provided. The piezoelectric device has a first electrode, a piezoelectric layer, and a second electrode stacked in this order on a substrate. The first electrode and the second electrode are arranged so as not to overlap each other in the stacking direction.

14 Claims, 6 Drawing Sheets

(51) Int. Cl.
*H10N 30/06* (2023.01)
*H10N 30/853* (2023.01)
*H10N 30/87* (2023.01)
*G06F 3/041* (2006.01)

(52) U.S. Cl.
CPC ......... *H10N 30/853* (2023.02); *G06F 3/0412* (2013.01); *G06F 3/0414* (2013.01)

(58) Field of Classification Search
USPC .................................................. 310/365, 366
See application file for complete search history.

(56) References Cited

U.S. PATENT DOCUMENTS

| | | | |
|---|---|---|---|
| 2003/0218519 A1 | 11/2003 | Nishimura et al. | |
| 2004/0051161 A1 | 3/2004 | Tanaka et al. | |
| 2005/0105038 A1 | 5/2005 | Kondo et al. | |
| 2007/0169324 A1 | 7/2007 | Yajima et al. | |
| 2013/0049544 A1* | 2/2013 | Yokoyama ........... | H10N 30/853 310/365 |
| 2013/0134838 A1* | 5/2013 | Yun .................... | H03H 9/02228 29/25.35 |
| 2014/0285069 A1 | 9/2014 | Suenaga et al. | |
| 2015/0228885 A1 | 8/2015 | Abbott, Jr. et al. | |
| 2017/0016783 A1 | 1/2017 | Hall et al. | |
| 2017/0016785 A1 | 1/2017 | Hall | |
| 2019/0326878 A1* | 10/2019 | Kakita ................ | H03H 9/6483 |
| 2020/0381610 A1 | 12/2020 | Arimoto et al. | |

FOREIGN PATENT DOCUMENTS

| | | |
|---|---|---|
| CN | 1692506 A | 11/2005 |
| CN | 104078560 A | 10/2014 |
| JP | 5-296713 A | 11/1993 |
| JP | 2000-349357 A | 12/2000 |
| JP | 2002-261339 A | 9/2002 |
| JP | 2003-20274 A | 1/2003 |
| JP | 2005-203706 A | 7/2005 |
| JP | 2005-259783 A | 9/2005 |
| JP | 2006-156690 A | 6/2006 |
| JP | 2015-91069 A | 5/2015 |
| JP | 2018-170488 A | 11/2018 |
| JP | 2018-170503 A | 11/2018 |

OTHER PUBLICATIONS

Office Action dated Nov. 21, 2023 in connection with the counterpart European Patent Application No. EP 20 773 928.5 (4 pages).
Office Action issued on Nov. 8, 2022 for corresponding Japanese Patent Application No. 2019-052876, along with an English translation (6 pages).
Extended European Search Report issued on Nov. 21, 2022, for corresponding European Patent Application No. 20773928.5 (7 pages).
International Search Report issued for corresponding International Patent Application No. PCT/JP2020/010302 on May 26, 2020, along with an English translation.
Written Opinion issued for corresponding International Patent Application No. PCT/JP2020/010302 on May 26, 2020.
Korean Office Action issued on May 28, 2024, in connection with the Korean Patent Application No. 10-2021-7029494, with its English Translation 5 pages.
Extended European Search Report dated Nov. 21, 2023 in connection with the counterpart European Patent Application No. EP 20 773 928.5 (4 pages).
Office Action issued on Dec. 8, 2023 for corresponding Chinese Patent Application No. 202080021284.6, along with an English translation (15 pages).

* cited by examiner (A) IDEAL STATE (B)

(A) TOP VIEW (B) I-I' CROSS-SECTIONAL VIEW (A) TOP VIEW (B) II-II' CROSS-SECTIONAL VIEW (A) TOP VIEW (B) III-III' CROSS-SECTIONAL VIEW (A) TOP VIEW (B) IV-IV' CROSS-SECTIONAL VIEW (A)

(B)

PIEZOELECTRIC DEVICE AND METHOD OF MANUFACTURING PIEZOELECTRIC DEVICE

CROSS REFERENCE TO RELATED APPLICATION

This application is a National Stage of International Application No. PCT/JP2020/010302, filed on Mar. 10, 2020, which designates the United States and was published in Japan, and which is based upon and claims priority to Japanese Patent Application No. 2019-052876, filed on Mar. 20, 2019, in the Japan Patent Office. All of the aforementioned applications are hereby incorporated by reference in their entireties.

TECHNICAL FIELD

The present invention relates to a piezoelectric device, and a method of manufacturing a piezoelectric device.

BACKGROUND ART

Conventionally, a piezoelectric device, which makes use of the piezoelectric effect of a substance, has been adopted. The piezoelectric effect is a phenomenon in which microscopic polarization occurs in proportion to a pressure applied to a substance. Various sensors such as pressure sensors, acceleration sensors, or acoustic emission (AE) sensors for detecting elastic waves have been manufactured by utilizing the piezoelectric effect.

In recent years, touch panels have been used as input interfaces of information processing devices such as smartphones, and applying piezoelectric devices to touch panels is increasing. A touch panel is integrated into the display device of an information processing device, and high transparency to visible light is required to improve the visibility. On the other hand, it is desirable for the piezoelectric layer to be highly responsive to pressure in order to accurately detect operations by a finger.

A configuration of a cantilever type deformable device having a stack of a piezoelectric film and electrodes for deforming the piezoelectric film by the inverse piezoelectric effect, in which the edges of the electrodes of the respective layers are arranged so as not to align on the same straight line extending in the film thickness direction, is known. (See, for example, Patent Document 1). In this structure, the stress concentration due to deformation during driving the device is reduced by making the lowermost electrode the largest and by reducing the electrode size toward the upper layer.

PRIOR ART DOCUMENTS

Patent Document(s)

Patent Document 1: JP Patent Application Laid-open Publication No. H05-296713

SUMMARY OF THE INVENTION

Technical Problem to be Solved

Microcracking often occurs in piezoelectric layers due to surface roughness of, or foreign substances on the substrates. Such microcracks may form a leakage path that electrically cause a short-circuit between the top and bottom electrodes. This phenomenon becomes more prominent as the piezoelectric film is thinner.

An objective of the invention is to provide a structure capable of suppressing leakage current between electrodes which sandwich a piezoelectric layer, and reducing deterioration in piezoelectric characteristics.

Solution to Solve the Technical Problem

In the first aspect of the invention, a piezoelectric device includes a substrate, a first electrode, a piezoelectric layer, and a second electrode. The first electrode, the piezoelectric layer, and the second electrode are stacked in this order on the substrate, wherein the first electrode and the second electrode are arranged so as not to overlap each other in a stacking direction.

In one example, the first electrode is formed in a pattern having two or more stripes, and the second electrode is formed in an area corresponding to spaces between adjacent stripes of the first electrode.

In another example, one of the first electrode and the second electrode is formed in a patch pattern, and the other of the first electrode and the second electrode is formed in a planar pattern obtained by cutting away the patch pattern.

In the second aspect of the invention, a method of manufacturing a piezoelectric device includes forming a first electrode on a substrate; forming a piezoelectric layer having a wurtzite crystal structure on the first electrode; and forming a second electrode on the piezoelectric layer so as not to overlap the first electrode in a film thickness or stacking direction.

Advantageous Effect of the Invention

With the above-described configurations, leakage current between electrodes sandwiching the piezoelectric layer can be suppress, and deterioration in the piezoelectric characteristics can be reduced.

DESCRIPTION OF EMBODIMENTS

Figure 1:
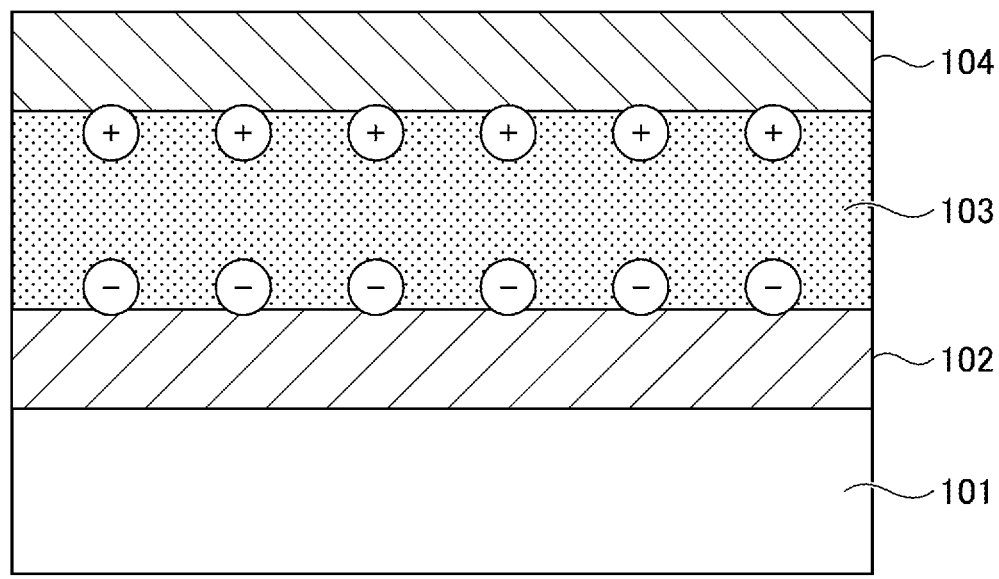
FIG. 1 is a diagram illustrating microcracks occurring in a piezoelectric layer.
Figure 1:
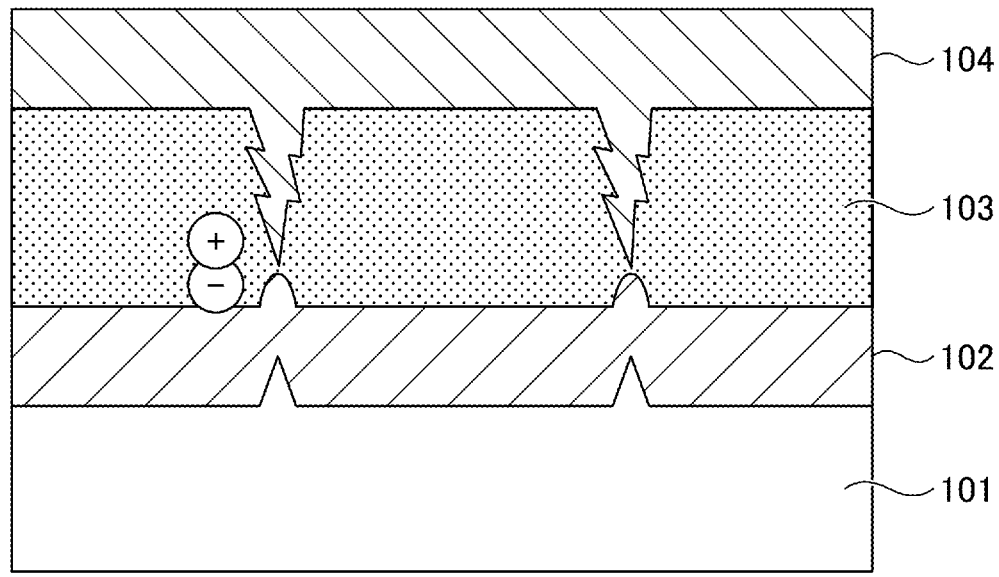

FIG. 1 is a diagram more particularly illustrating a technical issue of microcracking found by the inventors. In general, a layered structure in which a piezoelectric layer 103 is provided between electrodes 102 and 104 is provided on a substrate 101 from the viewpoint of convenience of the manufacturing process and structural stability.

In the ideal state shown in FIG. 1 (A), electrical charges with a specific polarity (for example, positive charges) appear at or near the interface between the piezoelectric layer 103 and the electrode 104, and electrical charges with an opposite polarity (for example, negative charges) appear at or near the interface between the piezoelectric layer 103 and the electrode 102, upon application of pressure. In contrast, when the piezoelectric layer 103 is pulled in the thickness direction, negative charges appear at the interface between the piezoelectric layer 103 and the electrode 104, and positive charges appear at the interface between the piezoelectric layer 103 and the electrode 102. Thus, mechanical energy can be converted into electrical energy by making use of polarization of the crystal structure of the piezoelectric layer 103.

As shown in FIG. 1 (B), if foreign substances, protrusions, pinholes, or the like are present on the surface of the substrate 101 or the surface of the electrode 102, microcracks starting from these surface irregularities may be induced in the piezoelectric layer 103. If such microcracks run through the piezoelectric layer 103 in the thickness direction, a leakage path may be formed between the electrodes 104 and 102. In this case, the produced polarized charges are cancelled, and the piezoelectric effect disappears.

If the substrate 101 is made of a plastic, a resin, or the like, the surface tends to be rough or uneven. The surface roughness of the substrate 101 cannot be absorbed by the metal crystals of the overlying electrode 102. The surface of the metal film of the electrode 102 also becomes uneven, reflecting the surface state of the substrate 101. Cracking is likely to occur directly above foreign matters, protrusions, pinholes, or the like that may be present at the interface between the electrode 102 and the piezoelectric layer 103.

In the embodiment, to suppress the occurrence of a leakage path running between the electrodes provided on both sides of the piezoelectric layer, a piezoelectric device is configured such that the electrodes do not overlap each other in the stacking direction. Even without overlapping of the electrodes in the stacking direction, electrical charges are uniformly distributed at the surface or the interface of the piezoelectric film, and can be appropriately extracted. By configuring the electrodes so as not to overlap in the stacking direction, an additional advantageous effect that the stress is reduced and bending of the layered structure is suppressed, can also be achieved. In this specification and appended claims, the expression that the electrodes "do not overlap" in the stacking direction means that almost all the parts of the bottom electrode and the top electrode do not overlap each other, viewed in the stacking direction. A slight overlap, which may be caused by variations in the edge position or the size of the electrodes due to manufacturing errors, design around, or the like is also within the scope of the configuration of the electrodes which "do not overlap" each other.

First Embodiment

Figure 2:
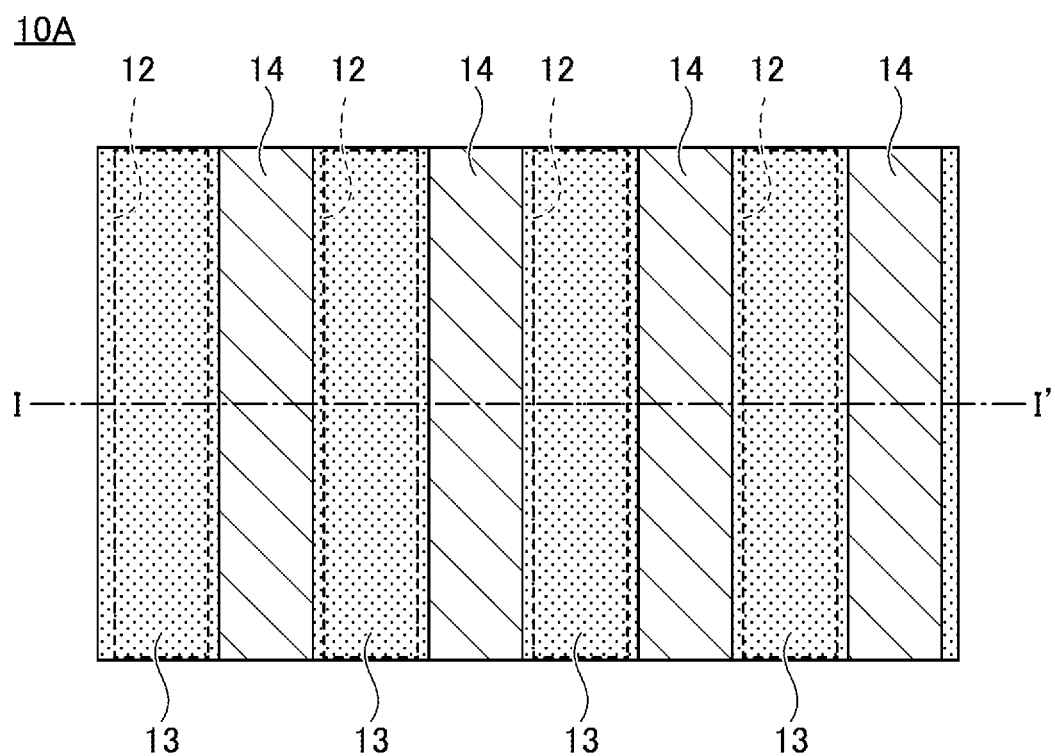
FIG. 2 is a schematic diagram of a piezoelectric device according to the first embodiment.
Figure 2:
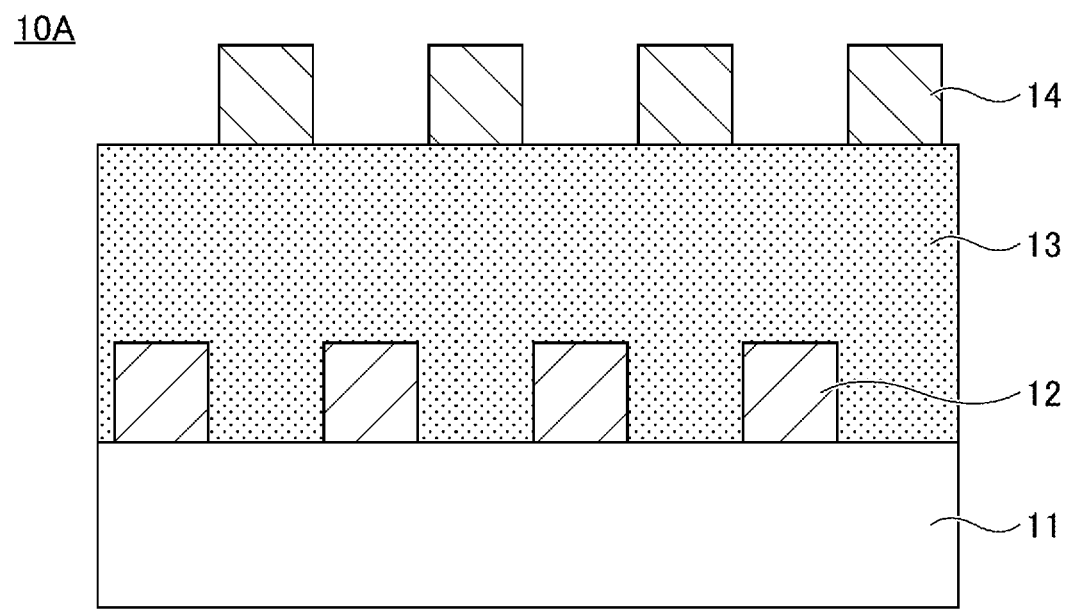

FIG. 2 is a schematic diagram of a piezoelectric device 10A according to the first embodiment. FIG. 2 (A) shows a top view, and (B) shows a cross-sectional view taken along the I-I' line of (A). The piezoelectric device 10A has a first electrode 12 formed on a substrate 11, a piezoelectric layer 13 provided on the first electrode 12, and a second electrode 14 provided on the piezoelectric layer 13. The directional term "on" does not intend the absolute direction, and it merely denotes the upper side when viewed in the stacking direction.

The first electrode 12 and the second electrode 14 are formed in stripe patterns extending in the same direction, but are arranged so as not to overlap each other viewed in the cross-section taken in the thickness direction. The second electrode 14 is provided in a region corresponding to the space between adjacent stripes of the first electrode 12.

With this configuration, when pressure is applied to the piezoelectric layer 13, surface charges appear in the piezoelectric layer 13, and a voltage is generated. By measuring the electric current, the polarization proportional to the pressure can be known. The unit cell of the crystal structure of the piezoelectric layer 13 does not have a point-symmetric center, and the atom at the crystal center is offset from the point-symmetric center of the crystal, for example, upward in the crystal growth direction. In this case, the positive charges are biased to the interface between the piezoelectric layer 13 and the upper electrode 14, and the negative charges are biased to the interface between the piezoelectric layer 13 and the lower electrode 12. Without application of a pressure, these charges are neutralized by being combined with floating charges in the air or other charges on the metal surface, and no voltage is generated.

When a pressure is applied to the piezoelectric layer 13 from, for example, the upper electrode 14, the atom at the crystal center moves closer to the point-symmetric center, and the polarization in the piezoelectric layer 13 decreases. In other words, the amount of charges having been distributed near the interface decreases. As a result, those charges that have been paired up with the vanished charges become surplus, and a voltage is generated. These excess charges are also uniformly distributed near the interface, and accordingly, the change in the polarization state due to application of the pressure can be detected, even if the upper electrode 14 and the lower electrode 12 do not overlap each other in the film thickness direction or the stacking direction.

With this structure, even if microcracking occurs, starting from a foreign matter, a protrusion, or a pinhole that may be preset on the surface of the substrate 11 or the electrode 12, and even if such microcracking extends in the thickness direction, the formation of a leakage path that electrically short-cuts the lower electrode 12 and the upper electrode 14 can be suppressed.

The piezoelectric device 10A may be fabricated by the following process. First, the electrode 12 is formed on the substrate 11. The material of the substrate 11 is arbitrary, and it may be a substrate made of an inorganic material such as a glass substrate, a sapphire substrate, or an MgO substrate, or alternatively, it may be a plastic substrate. With an inorganic substrate, the surface is smooth with few protrusions or pinholes that may cause cracking, and the occurrence of cracking itself can be reduced. With a plastic or resin substrate, the surface tends to be uneven, but it is flexible, easy to handle, and has a wide range of application.

Because the piezoelectric device 10A is designed such that the electrodes 12 and 14 do not overlap each other in the film thickness direction or the stacking direction, formation of a leakage path can be suppressed even if the surface of the substrate 11 is not even. The substrate 11 may be made of a polymer such as polyethylene terephthalate (PET), polyethylene naphthalate (PEN), polycarbonate (PC), acrylic resin, cycloolefin polymer, polyimide (PI), or the like. Of these, polyethylene terephthalate (PET), polyethylene naphthalate (PEN), polycarbonate (PC), acrylic resin, and cycloolefin polymer are colorless and transparent materials, and are suitable for applications in which light is transmitted through the back surface of the substrate 11.

The electrode 12 is formed on the substrate 11. The electrode can be formed of an appropriate conductor, and it may be formed of, for example, a transparent amorphous oxide conductor. Such an oxide conductor may be "transparent" to visible light, or "transparent" to light in a specific wavelength band to be used, depending on the application of the piezoelectric device 10A.

For the transparent amorphous oxide conductor, indium tin oxide (ITO), indium zinc oxide (IZO), etc. can be used. An electrode film with a thickness of 10-200 nm, preferably 10-100 nm may be formed using these materials by direct current (DC) or radio frequency (RF) magnetron sputtering. The electrode film can be patterned into the electrode 12 by an ordinary technique of photolithography and wet etching.

If ITO is used, the tin (Sn) content ratio Sn/(In+Sn) may be, for example, 5 to 15 wt %. Within this range, amorphous ITO transparent to visible light can be formed by means of sputtering at room temperature.

If IZO is used, the zinc (Zn) content ratio Zn/(In+Zn) may be, for example, around 10 wt %. IZO is also transparent to visible light, and an amorphous film can be formed by sputtering at room temperature.

Next, the piezoelectric layer 13 is formed over electrode 12 and the substrate 11 by sputtering. The piezoelectric layer 13 is formed of a piezoelectric material having a wurtzite crystal structure, and its thickness is 200 nm to 5 µm, for example.

If the thickness of the piezoelectric layer 13 is less than 200 nm, the first electrode 12 and the second electrode 14 are too close to each other. In this case, the influence of the microcracking becomes relatively conspicuous, and it may be difficult to suppress leakage current even if the lower electrode and the upper electrode do not overlap each other in the thickness direction. Accordingly, the thickness of the piezoelectric layer 13 is preferably 500 nm to 5 µm, and more preferably 700 nm to 5 µm.

By employing a sputtering process to form the electrode 12 and the piezoelectric layer 13, uniform films can be formed with sufficient adhesion, while maintaining the composition ratios of the compounds of the targets. In addition, a film can be accurately formed to a desired thickness simply by controlling the time.

A wurtzite crystal structure is represented by general formula AB, where A is a positive cation ($A^{n+}$) and B is a negative anion ($B^{n-}$). It is desirable to select a wurtzite piezoelectric material which can express piezoelectric properties to a certain degree or higher, and which can be crystallized in a low temperature process at or below 200° C. For example, zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), silicon carbide (SiC), etc. can be used. Any one or a combination of two or more of these components may be used.

When two or more of components are combined, the respective layers of the selected components may be formed one by one, or alternatively, a single layer may be formed simultaneously using the targets of the selected components. The selected one or the combination of two or more of the components may be used as the main component, and other components may be optionally added. The content of the optionally added sub-component is not particularly limited as long as the advantageous effect of the present invention can be achieved. The content of such a sub-component other than the main component is, for example, from 0.1 to 25 at. %.

For example, a wurtzite material containing ZnO or AlN as the main component is used. A metal which does not cause the main component to exhibit conductivity when incorporated into the main component may be added as a dopant. Such dopants may include silicon (Si), magnesium (Mg), vanadium (V), titanium (Ti), zirconium (Zr), lithium (Li), etc. One or a combination of two or more of the above-described dopants may be added. By adding one or more of these metals as a dopant, the occurrence of cracking can be reduced. When a transparent wurtzite crystalline material is used for the piezoelectric layer, the layered structure is suitable for use in a display.

Next, the electrode 14 is formed into a predetermined pattern on the piezoelectric layer 13. The electrode 14 is formed so as not to overlap the pattern of the electrode 12 in the film thickness or the stacking direction. If the lower electrode 12 is formed in a stripe or a line-and-space pattern, then the electrode 14 is formed so as to fill the area corresponding to the space between adjacent stripes of the electrode 12.

The electrode 14 may be formed of a transparent amorphous oxide conductor, or a good conductor such as a metal or an alloy. When a transparent amorphous oxide conductor is used, an ITO film having a thickness of 20 to 100 nm may be formed at room temperature by DC or RF magnetron sputtering, and patterned into a predetermined shape by photolithography and etching. The material of the electrode 14 may be the same as, or different from that of the electrode 12.

By forming the electrode 12 with an amorphous oxide conductor, undesirable protrusions or pinholes, which may cause microcracking, can be reduced on the surface of the electrode 12.

Second Embodiment

Figure 3:
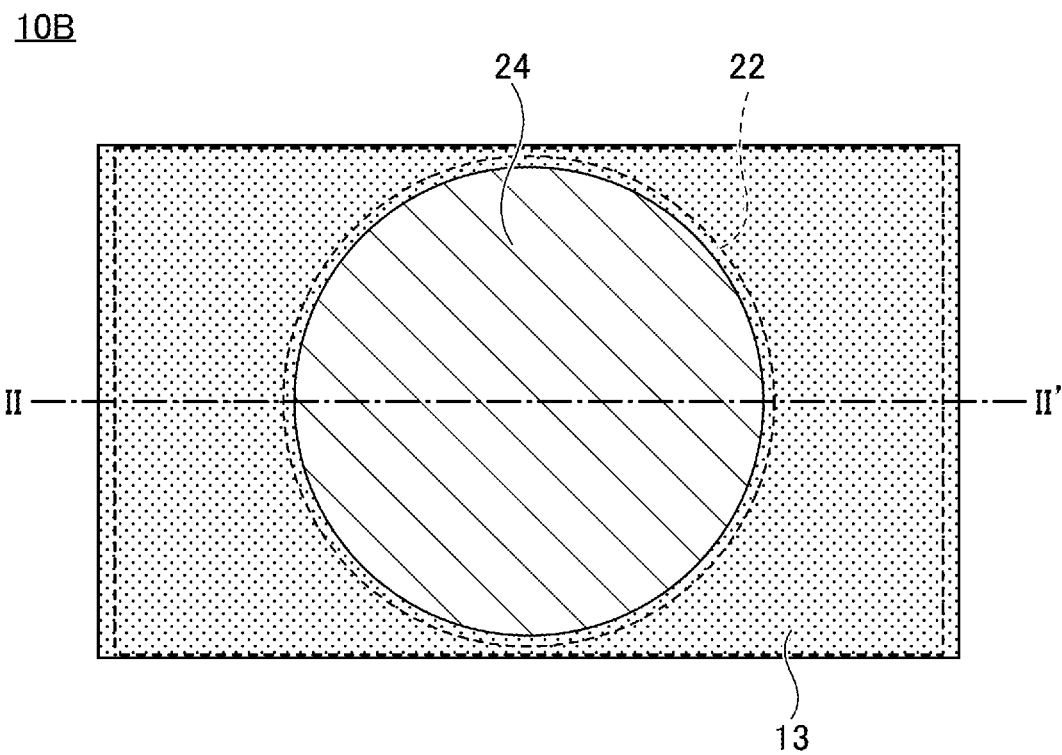
FIG. 3 is a schematic diagram of a piezoelectric device according to the second embodiment.
Figure 3:
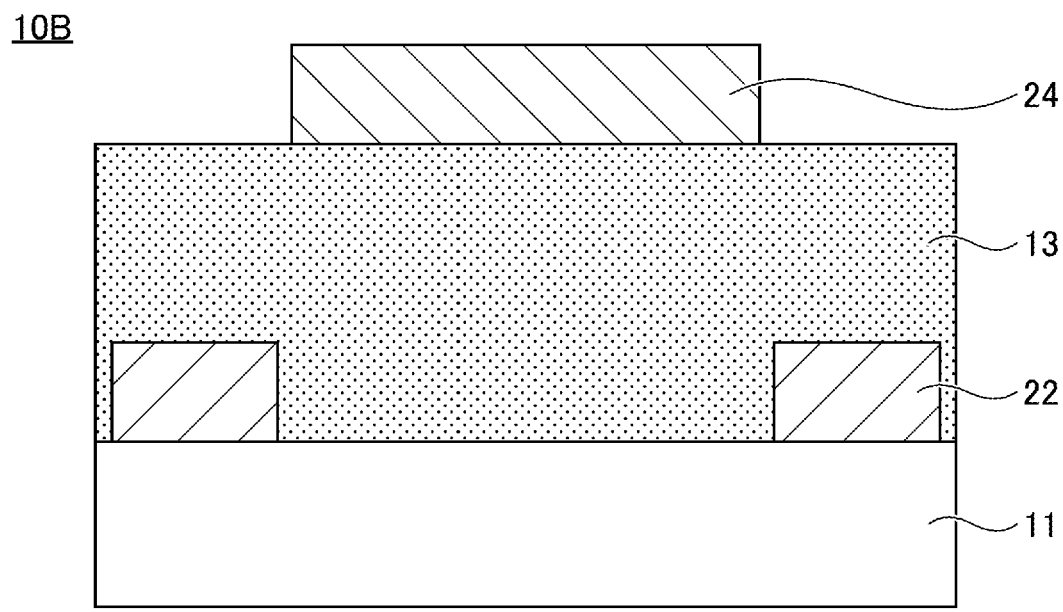

FIG. 3 is a schematic diagram of a piezoelectric device 10B according to the second embodiment. FIG. 2 (A) shows a top view, and (B) shows a cross-sectional view taken along the e II-II' line. Similar to the first embodiment, the second embodiment also provides a configuration in which a pair of electrodes provided on both sides a piezoelectric layer do not overlap each other in the film thickness direction or the stacking direction.

The piezoelectric device 10B has a first electrode 22 formed on a substrate 11, a piezoelectric layer 13 provided on the first electrode 22, and a second electrode 24 provided on the piezoelectric layer 13. Again, the directional term "on" indicates the upper side when viewed in the stacking direction.

The first electrode 12 and the second electrode 14 have complementary planar shapes. In the example of FIG. 3, the second electrode 24 is a round electrode, and the first electrode 22 has a pattern complementary with the round shape, namely a pattern that the circle is cut off from the solid film. Off course, the shape of the electrode 24 is not limited to the circle, and it may be an ellipse, a polygon, or other patch shapes. As to the polygon, any polygonal shape such as a triangle, a rectangle, a hexagon, an octagon, etc. can be adopted.

The other electrode 22, which is paired with the electrode 24, has a pattern complementary with the shape of the electrode 24, where the shape of the electrode 24 is cut out from the solid film. It is unnecessary that the upper electrode 24 provided on the piezoelectric layer 13 is always patterned in the patch shape such as a circle, a polygon, or the like, and instead, the lower electrode 22 may be formed in a patch pattern. In such a case, the upper electrode 24 is formed in a pattern complementary with the patch shape of the lower electrode 22. The stripe pattern of the first embodiment may also be called a complementary electrode pattern in terms that the upper and lower electrodes do not overlap each other.

In this configuration, when pressure is applied to the piezoelectric layer 13, positive charges appear on one of the surfaces of the piezoelectric layer 13 (for example, at the interface with the upper electrode 24), and negative charges appear and on the other surface (for example, at the interface with the lower electrode 22). By measuring the current flowing through the electrodes 22 and 24, the pressure applied to the piezoelectric layer 13 can be detected.

Owing to this structure, a leakage path can be prevented from being formed and short-circuiting between the lower electrode 22 and the upper electrode 24 even if microcracking is induced and extends in the thickness direction starting from a foreign matter, a protrusions, a pinholes, or the like that may be present on the surface of the substrate 11 or the electrode 22.

The manufacturing process of the piezoelectric device 10B is basically the same as that of the piezoelectric device 10A, and only the shapes of the electrodes 22 and 24 to be formed are different. Any suitable material can be used for the substrate 11, and a substrate made of an inorganic material such as a glass, sapphire, or MgO, or alternatively, a plastic substrate may be used. By using a plastic or resin substrate 11, the scope of applications is expanded in terms of flexibility and easiness to handle.

The electrode 22 may be formed of an appropriate conductor on the substrate 11. Depending on the application of the piezoelectric device 10B, the electrode 22 may be formed of a transparent conductive film "transparent" with respect to visible light or a target wavelength.

The piezoelectric layer 13 may be formed of a piezoelectric material having a wurtzite crystal structure, as in the first embodiment. Such a piezoelectric material is, for example, zinc oxide (ZnO), zinc sulfide (ZnS), zinc selenide (ZnSe), zinc telluride (ZnTe), aluminum nitride (AlN), gallium nitride (GaN), cadmium selenide (CdSe), Cadmium telluride (CdTe), silicon carbide (SiC), etc. Any one or a combination of two or more of these components may be used.

When two or more components are combined, the respective layers of the selected components may be formed one by one, or alternatively, a single layer may be formed simultaneously using the targets of the selected components. The selected one or the combination of two or more of the compounds may be used as the main component, and other components may be optionally added. The content of the optionally added sub-component is not particularly limited as long as the advantageous effect of the present invention is achieved. The content of such a sub-component is, for example, from 0.1 to 20 at. %, preferably, from 0.1 to 10 at. %, more preferably from 0.2 to 5 at. %.

For example, a wurtzite material containing ZnO or AlN as the main component is used. A metal which does not cause the main component to exhibit conductivity when incorporated into the main component may be added as a dopant. Such dopants may include silicon (Si), magnesium (Mg), vanadium (V), titanium (Ti), zirconium (Zr), lithium (Li), etc. One or a combination of two or more of the above-described dopants may be added. By adding one or more of these metals as a dopant, the occurrence of cracking can be reduced. When a transparent wurtzite crystalline material is used for the piezoelectric layer, the layered structure is suitable for use in a display.

The upper electrode 22 may have any pattern that does not overlap the pattern of the electrode 22 in the film thickness or the stacking direction, and it may be formed of a transparent amorphous oxide conductor, or a good conductor such as a metal or an alloy. If a transparent amorphous oxide conductor is used, an ITO film having a thickness of 20 to 100 nm may be formed at room temperature by, for example, DC or RF magnetron sputtering, and patterned into a predetermined shape by photolithography and etching. The material of the electrode 24 may be the same as, or different from the material of the electrode 22.

The configuration of the second embodiment enables electric charges produced in the piezoelectric layer to be extracted, while suppressing a leakage path from being formed between the upper and lower electrodes. In addition, because of the complementary electrode patterns formed on the upper side and the bottom side of the piezoelectric layer 13, a stress relaxation effect can also be expected.

Third Embodiment

Figure 4:
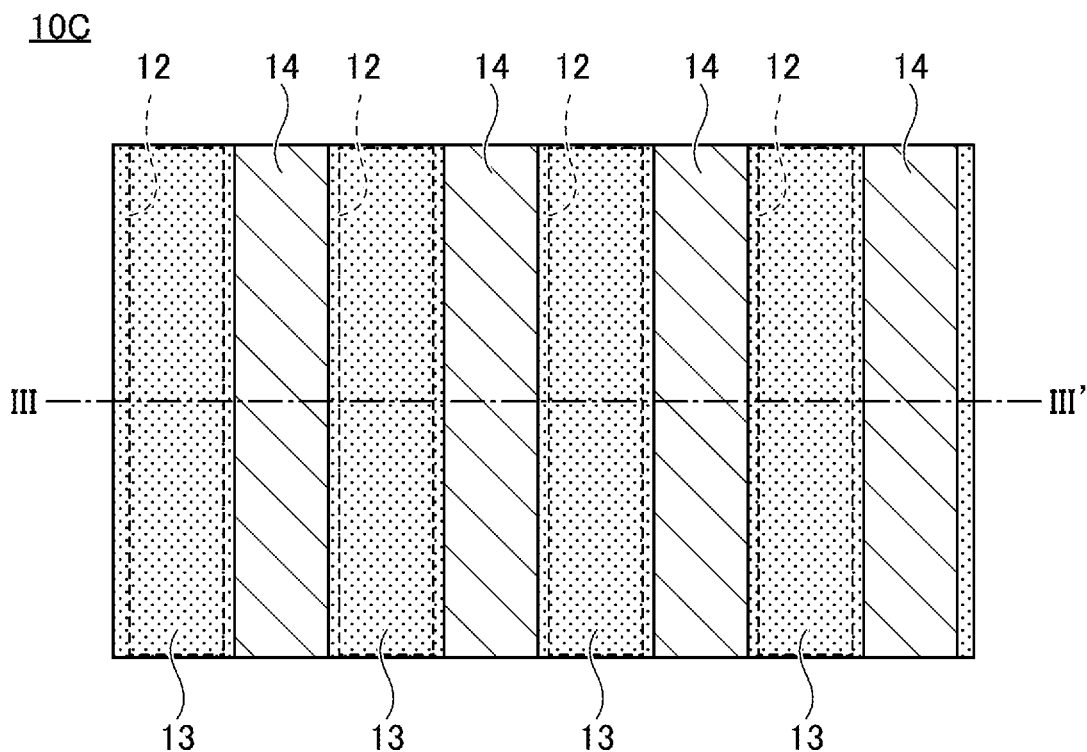
FIG. 4 is a schematic diagram of a piezoelectric device according to the third embodiment.
Figure 4:
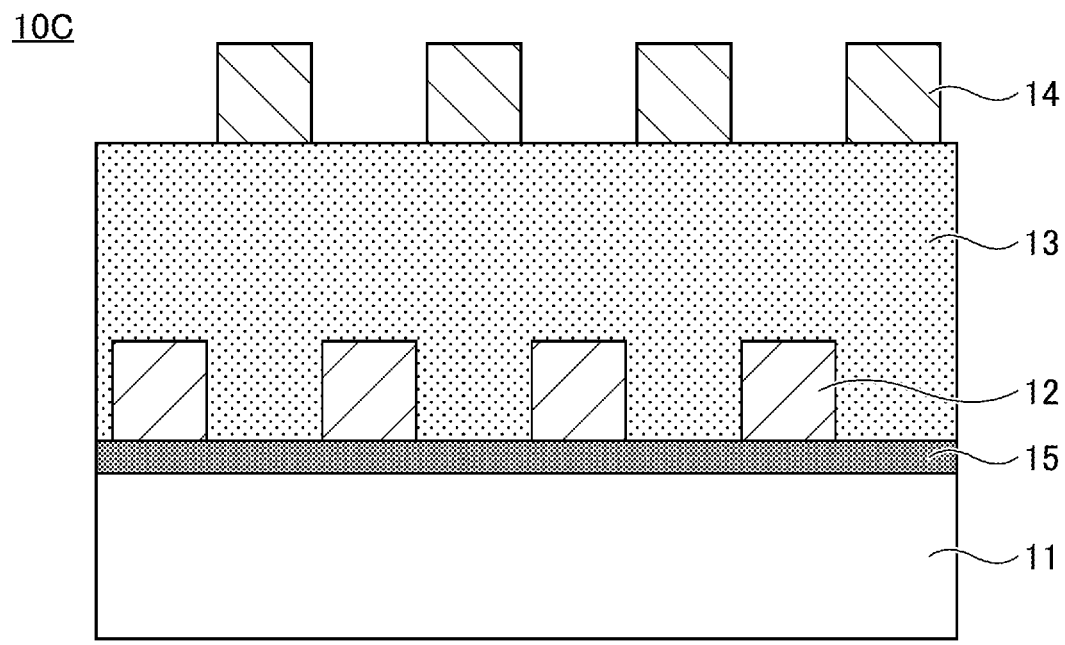

FIG. 4 is a schematic diagram of a piezoelectric device 10C according to the third embodiment. FIG. 4 (A) shows a top view, and (B) shows a cross-sectional view taken along the III-III' line. The piezoelectric device 10C has stripe electrode patterns similar to those of the first embodiment, as the complementary electrode patterns that do not overlap each other in the stacking direction.

In the third embodiment, an amorphous layer 15 is provided between the piezoelectric layer 13 and the substrate 11. The lower electrode 12 is formed on the amorphous layer 15. By providing the amorphous layer 15 on the substrate 11, roughness or unevenness of the underlayer can be absorbed even if a plastic substrate is used, and irregularities such as protrusions, pinholes or the like, which may be induced at the surface of the electrode 12, can be reduced. The surface of the amorphous layer 15 itself is smooth, and is thus unlikely to induce cracking in the piezoelectric layer.

If a plastic or a resin such as PET, PEN, PC, or an acrylic resin is used as the substrate 11, the amorphous layer 15 may be an organic amorphous layer. Examples of the amorphous organic material include, but are not limited to, acrylic resin, urethane resin, melamine resin, alkyd resin, and siloxane-based polymer. In particular, it is preferable to use a thermosetting resin composed of a mixture of a melamine resin, an alkyd resin and an organic silane condensation, as the organic substance. The organic amorphous layer is formed by a coating method, a spray method, or the like.

If the amorphous organic material used for the amorphous layer 15 is electrically conductive, the amorphous layer 15 may serve as a part of the electrode 12. Because the amorphous layer 15 absorbs the roughness or unevenness present at the surface of the substrate 11, and because the amorphous layer 15 itself has a smooth surface, cracking is unlikely to be induced from an area of the amorphous layer 15 facing the electrode 14.

Owing to this structure, the formation of a leakage path between the electrodes 12 and 14, provided on both sides of the piezoelectric layer 13 in the stacking direction, can be suppressed.

Other configurations, materials, and fabrication steps of the piezoelectric device 10C are the same as those in the first embodiment, and redundant description will be omitted.

The configuration of the third embodiment enables electric charges produced in the piezoelectric layer to be extracted, while effectively suppressing a leakage path from being formed between the upper and lower electrodes. In addition, because of the complementary electrode patterns formed on the upper side and the bottom side of the piezoelectric layer 13, a stress relaxation effect can also be expected.

Fourth Embodiment

Figure 5:
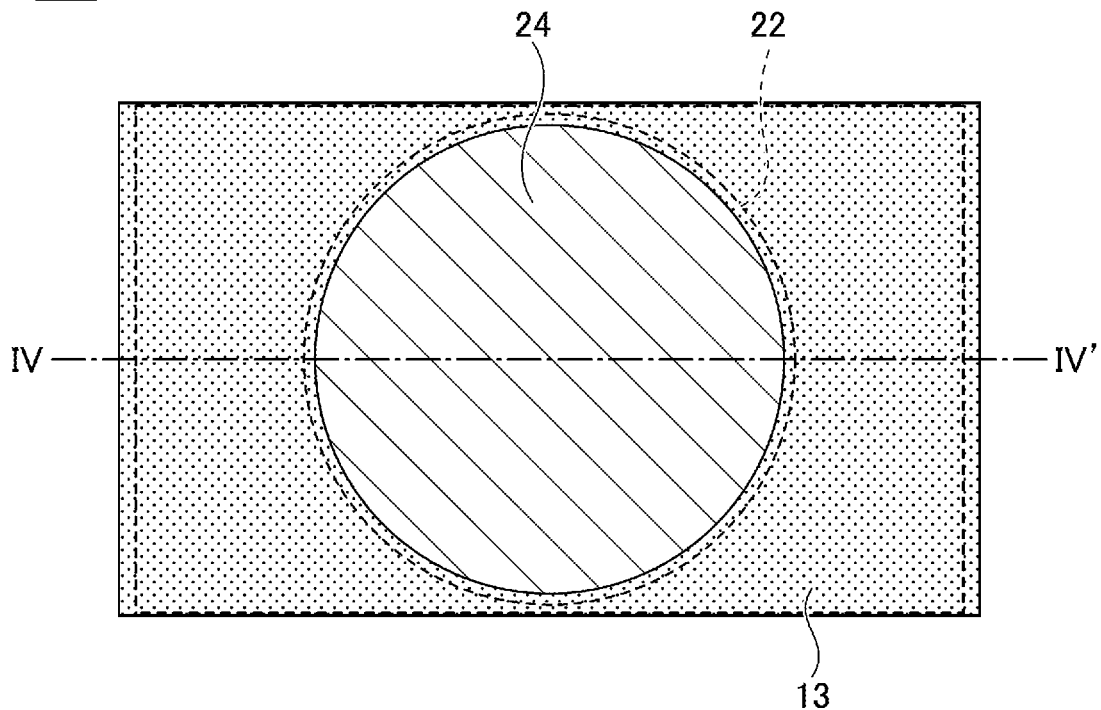
FIG. 5 is a schematic diagram of a piezoelectric device according to the fourth embodiment.
Figure 5:
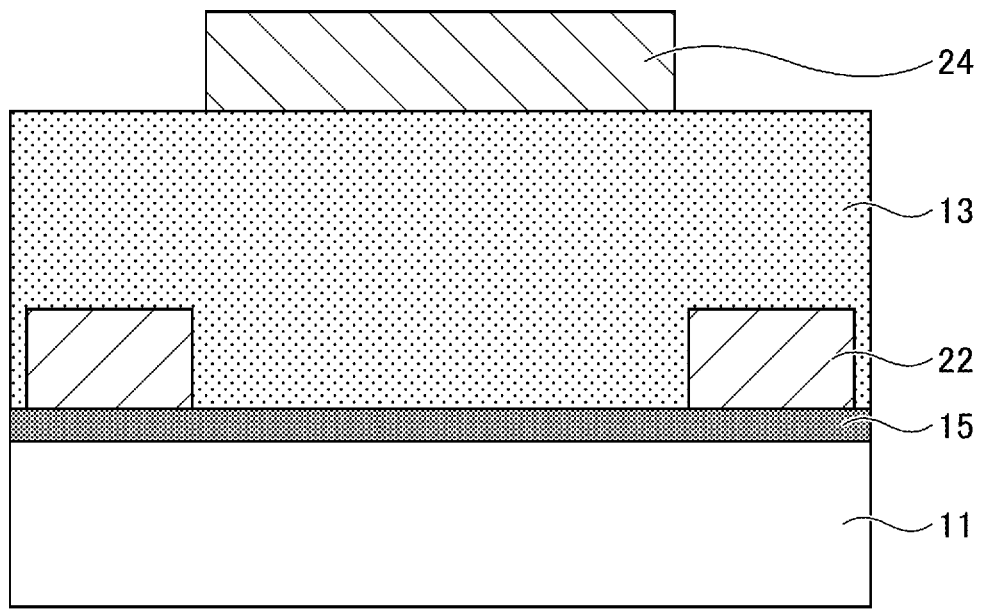

FIG. 5 is a schematic diagram of a piezoelectric device 10D according to the fourth embodiment. FIG. 5 (A) shows a top view, and (B) shows a cross-sectional view taken along the IV-IV' line. The piezoelectric device 10D employs a patch pattern and an inverted patch pattern, which corresponds to the remaining area after the patch is cut out, as the electrode patterns that do not overlap each other in the stacking direction, as in the second embodiment. The patch pattern is not limited to the round shape, and it may be an ellipse, a polygon, a rectangle, or the like.

In the fourth embodiment, an amorphous layer 15 is inserted between the piezoelectric layer 13 and the substrate 11, as in the third embodiment. The lower electrode 22 is formed on the amorphous layer 15. By providing the amorphous layer 15 on the substrate 11, roughness or unevenness of the underlayer can be absorbed when the substrate 11 is plastic, and protrusions, pinholes, or the like which may occur on the surface of the electrode 12 can be reduced. The surface of the amorphous layer 15 itself is smooth, and cracking is unlikely to be induced.

If a plastic or a resin such as PET, PEN, PC, or an acrylic resin is used as the substrate 11, the amorphous layer 15 may be an organic amorphous layer. Examples of the amorphous organic material include, but are not limited to, acrylic resin, urethane resin, melamine resin, alkyd resin, and siloxane-based polymer. In particular, it is preferable to use a thermosetting resin composed of a mixture of a melamine resin, an alkyd resin and an organic silane condensation, as the organic substance. The organic amorphous layer is formed by a coating method, a spray method, or the like.

Other configurations, materials, and fabrication steps of the piezoelectric device 10D are the same as those in the second embodiment, and redundant description will be omitted.

The configuration of the fourth embodiment enables electric charges produced in the piezoelectric layer to be extracted, while effectively suppressing a leakage path from being formed between the upper and lower electrodes. In addition, because of the complementary electrode patterns formed on the upper side and the bottom side of the piezoelectric layer 13, a stress relaxation effect can also be expected.

<Modifications>

Figure 6:
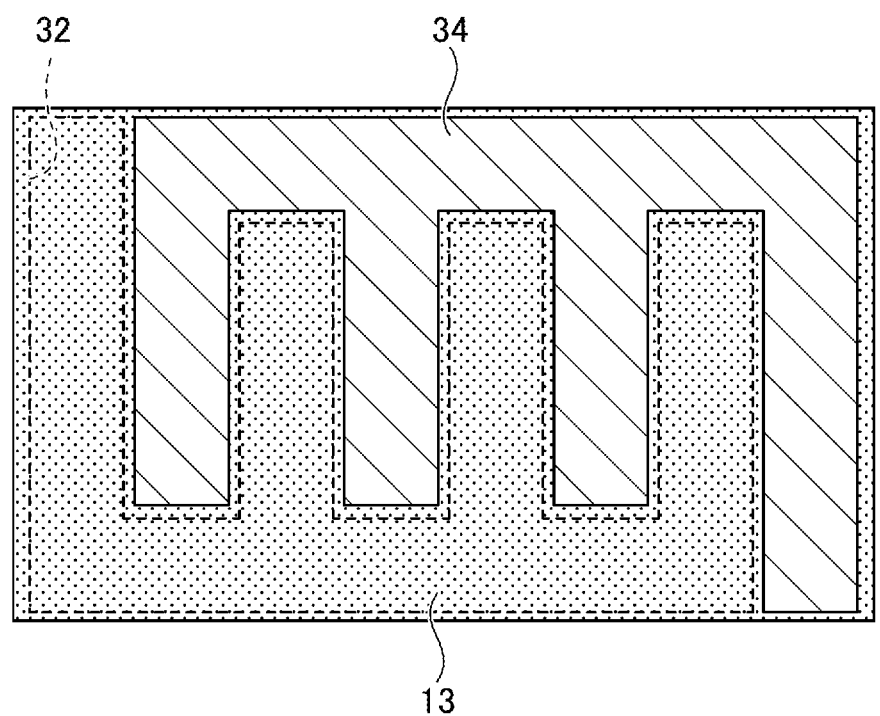
FIG. 6 shows a modification of the electrode pattern.
Figure 6:
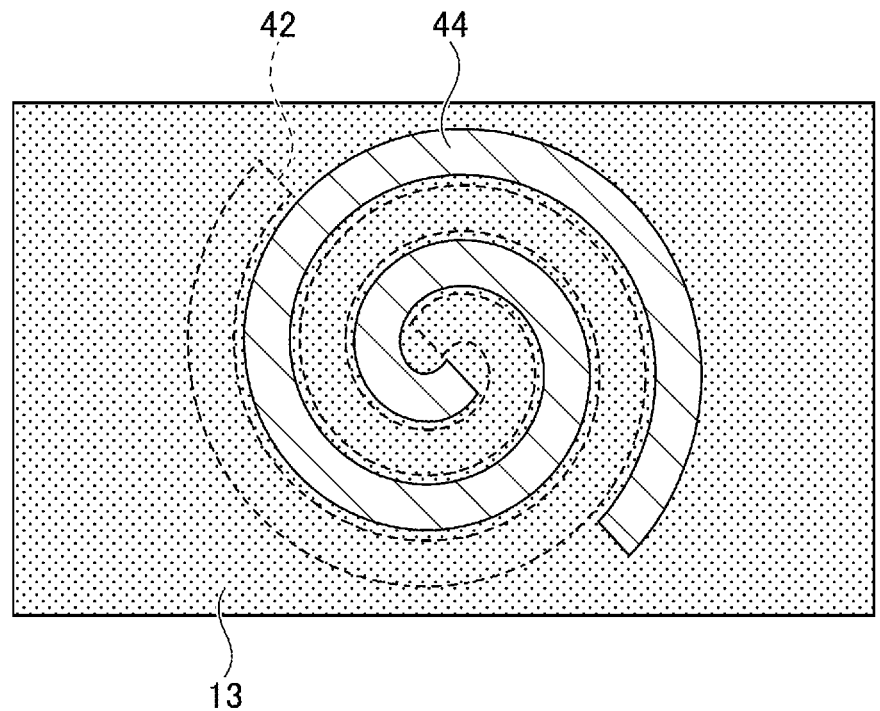

FIG. 6 shows other modified embodiments of the electrode pattern. The patterns of the pair of electrodes provided to the top and the bottom of the piezoelectric layer 13 are not limited to those shown in the first to fourth embodiments. Any suitable patterns can be employed as long as the electrode patterns provided to the top and the bottom of the piezoelectric layer 13 do not overlap each other in the stacking direction. It is desirable, from the viewpoint of extracting the electric charges produced at the surfaces (or the interfaces) of the piezoelectric layer 13, that one charge extraction port is provided to the upper electrode, and one charge extraction port is provided to the lower electrode. The surface area of the upper electrode and the surface area of the lower electrode may be substantially the same.

In the configuration of FIG. 6 (A), the lower electrode 32 and the upper electrode 34 are staggered comb electrodes or interdigit electrodes, which alternately extend in the different layers with the piezoelectric layer 13 interposed therebetween. The surface area of the electrode 32 and the surface area of the electrode 34 may be substantially the same. Even if a crack runs through the piezoelectric layer 13 in the thickness direction due to a protrusion, a pinholes, a foreign substance, or the like that may be present on the surface of the lower electrode 32, the formation of a leakage path or electrical short-circuit between the lower electrode 32 and the upper electrode 34 due to the cracking can be suppressed.

In the configuration of FIG. 6 (B), the lower electrode 42 and the upper electrode 44 are spiral electrodes which are coiled in the complementary manner at the different layers with the piezoelectric layer 13 interposed therebetween. The shape of the electrodes is not limited to a circular spiral as shown in FIG. 6 (B), and it may be a rectangular spiral or a polygonal spiral as long as the two electrodes do not vertically overlap each other.

The upper and the lower electrodes may be concentric electrodes that do not overlap each other although not shown in the figure. The lower electrode may have a single, a double or more annular patterns, and the upper electrode may have a single, a double or more annular patterns, each annulus being formed in the area corresponding to the space between two adjacent concentric rings of the lower electrode. The pattern is not limited to a circular ring, and may be a rectangular ring, a polygonal ring, or the like.

In the configurations of the modified embodiments, the amorphous layer 15 may be inserted between the substrate 11 and the lower electrode, as in the third and the fourth embodiments, whereby suppression of a leakage path may be further enhanced.

If a lower electrode is formed of a transparent amorphous oxide conductor on a plastic substrate 11, a low-resistance amorphous film may be formed on the plastic substrate 11 by introducing water during the sputtering process.

The piezoelectric device having any one of the electrode structures of the present invention may be used as a piezoelectric sensor of a touch panel or the like. Even if the thickness of the piezoelectric layer can be reduced to 200 μm or less, a leakage path can be suppressed from being formed between the electrodes, and the operational reliability can be maintained.

LISTING OF SYMBOLS 10A-10B: piezoelectric device
11: substrate
12, 22, 32, 42: first electrode
13: piezoelectric layer
14, 24, 34, 44: second electrode
15: amorphous layer

What is claimed is:

1. A piezoelectric device comprising:
    a substrate;
    a first electrode;
    an amorphous layer provided between the substrate and the first electrode;
    a piezoelectric layer; and
    a second electrode,
    wherein the first electrode, the piezoelectric layer, and the second electrode are stacked in this order on the substrate, and
    wherein the first electrode and the second electrode are arranged so as not to overlap each other in a stacking direction.

2. The piezoelectric device as claimed in claim 1,
    wherein the first electrode is formed in a pattern having two or more stripes, and the second electrode is formed in an area corresponding to spaces between adjacent stripes of the two or more strips of the first electrode.

3. The piezoelectric device as claimed in claim 1,
    wherein one of the first electrode and the second electrode is formed in a patch pattern, and the other of the first electrode and the second electrode is formed in a planar pattern obtained by cutting away the patch pattern.

4. The piezoelectric device as claimed in claim 1, wherein the first electrode and the second electrode are a pair of comb electrodes or spiral electrodes literately arranged in different layers with the piezoelectric layer interposed therebetween.

5. The piezoelectric device as claimed in claim 1, wherein a surface area of the first electrode is substantially equal to a surface area of the second electrode.

6. The piezoelectric device as claimed in claim 1, wherein the amorphous layer is an organic amorphous layer.

7. The piezoelectric device as claimed in claim 1, wherein the substrate is formed of a plastic or a resin.

8. The piezoelectric device as claimed in claim 1, wherein the piezoelectric layer is formed of a material selected from the group consisting of zinc oxide (ZnO), zinc sulfide (ZnS), zinc selenide (ZnSe), zinc telluride (ZnTe), aluminum nitride (AlN), gallium nitride (GaN), cadmium selenide (CdSe), cadmium telluride (CdTe), and silicon carbide (SiC), or a combination thereof, as a main component.

9. The piezoelectric device as claimed in claim 8, wherein the piezoelectric layer further comprises an element selected from a group consisting magnesium (Mg), vanadium (V), titanium (Ti), zirconium (Zr), lithium (Li), silicon (Si), and a combination thereof.

10. The piezoelectric device as claimed in claim 1, wherein a thickness of the piezoelectric layer is from 200 nm to 5 μm.

11. The piezoelectric device as claimed in claim 1, wherein the substrate comprises a non-piezoelectric material.

12. The piezoelectric device as claimed in claim 1, wherein the first electrode is in direct physical contact with a non-piezoelectric material.

13. The piezoelectric device as claimed in claim 1, wherein the substrate comprises a non-piezoelectric material and the first electrode is in direct physical contact with the non-piezoelectric material.

14. The piezoelectric device as claimed in claim 1, wherein the substrate is a multi-layer structure comprising a first substrate layer and a second substrate layer over the first substrate layer, and the second substrate layer comprises a non-piezoelectric material.

* * * * *